United States Patent
Law

(10) Patent No.: US 7,021,042 B2
(45) Date of Patent: Apr. 4, 2006

(54) GEARTRAIN COUPLING FOR A TURBOFAN ENGINE

(75) Inventor: Chi Law, South Glastonbury, CT (US)

(73) Assignee: United Technologies Corporation, Hartford, CT (US)

( * ) Notice: Subject to any disclaimer, the term of this patent is extended or adjusted under 35 U.S.C. 154(b) by 96 days.

(21) Appl. No.: 10/319,079

(22) Filed: Dec. 13, 2002

(65) Prior Publication Data
US 2004/0112041 A1    Jun. 17, 2004

(51) Int. Cl.
*F02K 3/02*    (2006.01)
(52) U.S. Cl. .................. 60/226.1; 60/262; 384/913
(58) Field of Classification Search ............... 60/226.1, 60/226.3, 262, 263, 793; 384/913
See application file for complete search history.

(56) References Cited

U.S. PATENT DOCUMENTS

| | | | |
|---|---|---|---|
| 2,787,603 A | | 4/1957 | Palsullch et al. |
| 3,922,852 A | * | 12/1975 | Drabek .................. 60/226.1 |
| 4,251,987 A | * | 2/1981 | Adamson .................. 60/805 |
| 4,751,816 A | * | 6/1988 | Perry .................. 60/226.1 |
| 4,799,354 A | * | 1/1989 | Midgley .................. 60/788 |
| 4,827,712 A | * | 5/1989 | Coplin .................. 60/226.1 |
| 4,887,424 A | | 12/1989 | Geidel et al. |
| 5,010,729 A | * | 4/1991 | Adamson et al. ........... 60/226.1 |
| 5,107,676 A | * | 4/1992 | Hadaway et al. .......... 60/226.1 |
| 5,349,814 A | * | 9/1994 | Ciokajlo et al. ........... 60/226.1 |
| 6,158,893 A | * | 12/2000 | Heshmat .................. 384/106 |
| 6,284,366 B1 | * | 9/2001 | Konig et al. ................. 428/336 |
| 6,517,249 B1 | * | 2/2003 | Doll ........................ 384/492 |
| 6,622,473 B1 | | 9/2003 | Becquerelle et al. |
| 6,655,842 B1 | | 12/2003 | Kanayama et al. |
| 6,732,606 B1 | * | 5/2004 | Zhu et al. .................... 74/460 |
| 6,815,400 B1 | | 11/2004 | Jee et al. |

FOREIGN PATENT DOCUMENTS

GB    705067    3/1954

OTHER PUBLICATIONS

Chhowalla et al. "Thin films of fullerence-like MOS2 nanoparticles with ultra-low friction and wear", Engineering Department, University of Cambridge, pp. 164-167, Jun. 2000.*

Zabinski et al. "The effects of dopants on the chemistry and tribology of sputter-deposited MOS2 films", Tribology Transactions, vol. 38, pp. 894-904, Oct. 1995.*

S.W. Kandebo, Pratt & Whitney Launches Geared Turbofan Engine, Aviation Week & Space Technology, Feb. 23, 1998, pp. 32-34.

* cited by examiner

Primary Examiner—William H. Rodriguez
(74) Attorney, Agent, or Firm—Bachman & LaPointe, P.C.

(57) ABSTRACT

Molybdenum disulfide ($MoS_2$) is used as a journal coating for a gearing system. A particular application is the planetary gear system of a geared turbofan engine. Particularly advantageous coatings are deposited via physical vapor deposition (PVD) techniques.

16 Claims, 4 Drawing Sheets

GEARTRAIN COUPLING FOR A TURBOFAN ENGINE

BACKGROUND OF THE INVENTION (1) Field of the Invention

This invention relates to turbomachinery, and more particularly to geared turbofan engines.

(2) Description of the Related Art

In high bypass turbofan engines it is advantageous that the turbine drive the fan through a reduction gearing system. This permits the turbine to operate at the relatively high speeds at which it is efficient while the much larger diameter fan operates at the relatively lower speeds at which it is efficient. One possible gearing system is a planetary system. In exemplary implementation, the turbine shaft directly drives a sun gear. A number of planet gears are enmeshed between the sun gear and a ring gear that is non-rotating relative to an engine nacelle or other environmental structure in which the turbofan is mounted. The fan is directly driven by a cage holding the planet gears. Bearings are typically provided: (a) for supporting the turbine shaft and sun gear relative to the environment; and (b) for rotatably supporting the planetary gears relative to the cage. Whereas the former are often rolling-element bearings, the latter are advantageously journal bearings. Journal bearings may offer an advantageous balance of compactness and load-carrying ability.

To operate under the relatively high power transmission conditions of the turbofan engine, the journal bearings will typically require lubrication. Oil is advantageously used as a lubricant. Depending on the engine and application, various operating conditions may cause short periods in which the bearings operate under mixed or boundary lubrication conditions, potentially resulting in bearing wear. Additionally, failures of lubrication systems must be contemplated. In an aircraft application, it is particularly desirable that the bearings not seize for a substantial time after a lubrication failure period. Many forms of engine damage may cause such failure. In an aircraft application if rotation of the damaged engine were stopped, the stopped engine would constitute an extreme source of aerodynamic drag. Accordingly, the damaged engine is advantageously allowed to rotate, driven by the air flow resulting from the forward velocity of the aircraft in a process called "windmilling". The engine so rotates at a rotational speed, typically substantially less than that of a powered engine. A windmilling engine has significantly less aerodynamic drag than does a completely stopped engine. Under the Extended Range Twin-Engine Operations (ETOPS) rating system, certain aircraft may be required to operate with a windmilling engine for a period of up to 180 minutes.

In order to prevent seizure and improve life, it is advantageous that the journal outer surface and/or sleeve inner surface be provided with a lubricious coating.

BRIEF SUMMARY OF THE INVENTION

I have determined that molybdenum disulfide ($MoS_2$) can be a particularly effective journal coating for turbine gearing systems. Particularly advantageous coatings include sputter-deposited $MoS_2$ and cathodic arc-deposited fullerene-like $MoS_2$.

The details of one or more embodiments of the invention are set forth in the accompanying drawings and the description below. Other features, objects, and advantages of the invention will be apparent from the description and drawings, and from the claims.

BRIEF DESCRIPTION OF THE DRAWINGS

Like reference numbers and designations in the various drawings indicate like elements.

DETAILED DESCRIPTION

Figure 1:
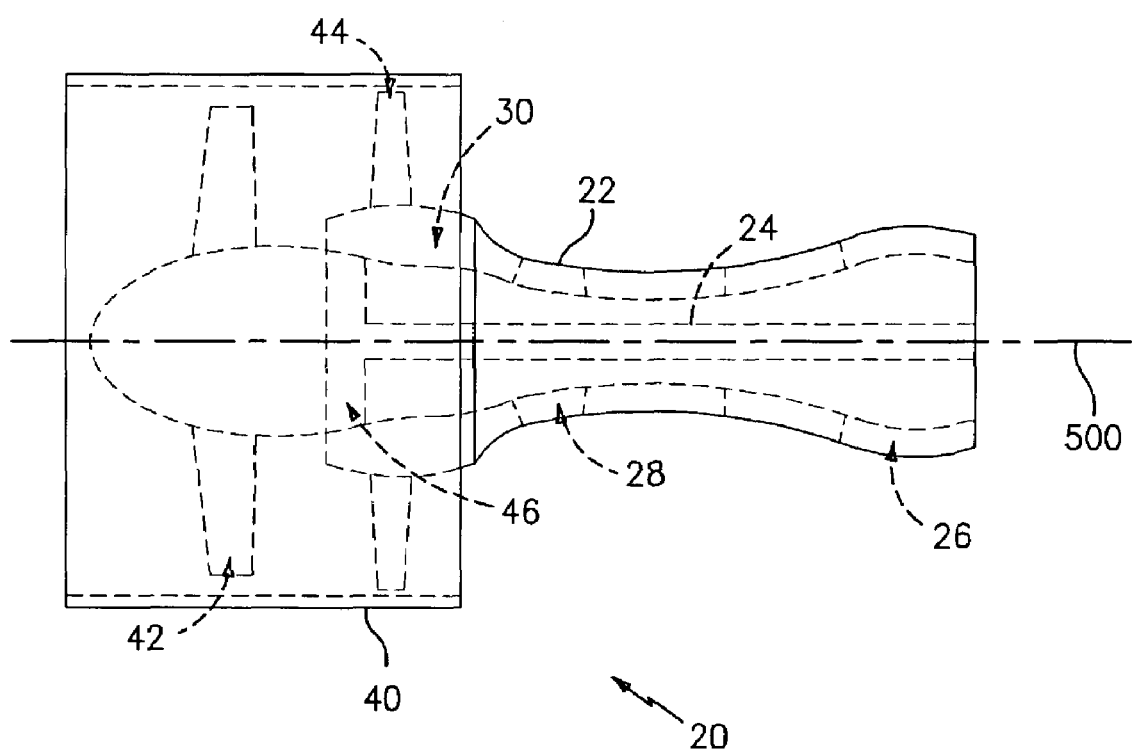
FIG. 1 is a schematic longitudinal view of a geared turbofan engine.
Figure 2:
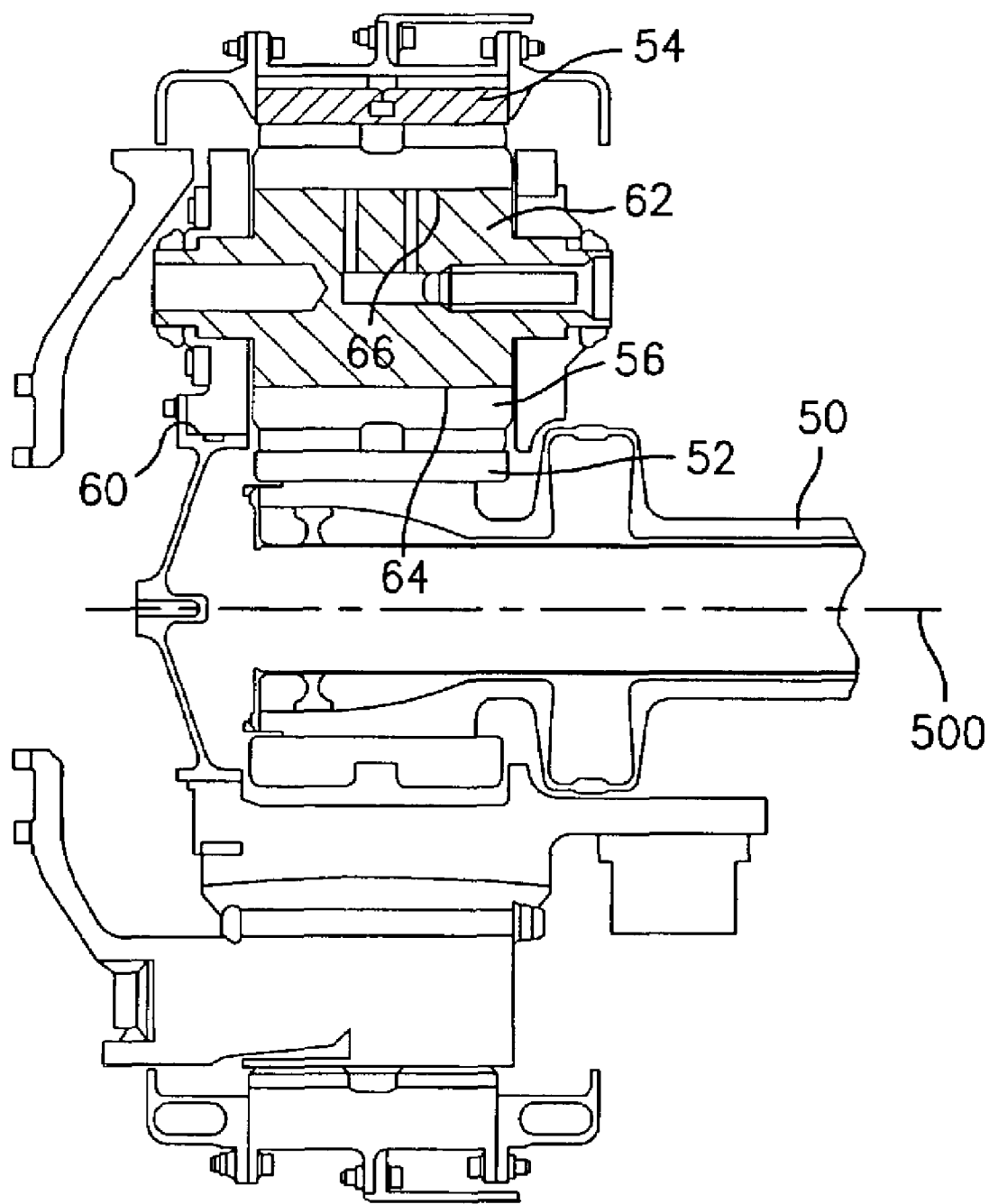
FIG. 2 is a longitudinal semi-schematic sectional view of a transmission of the engine of FIG. 1.
Figure 3:
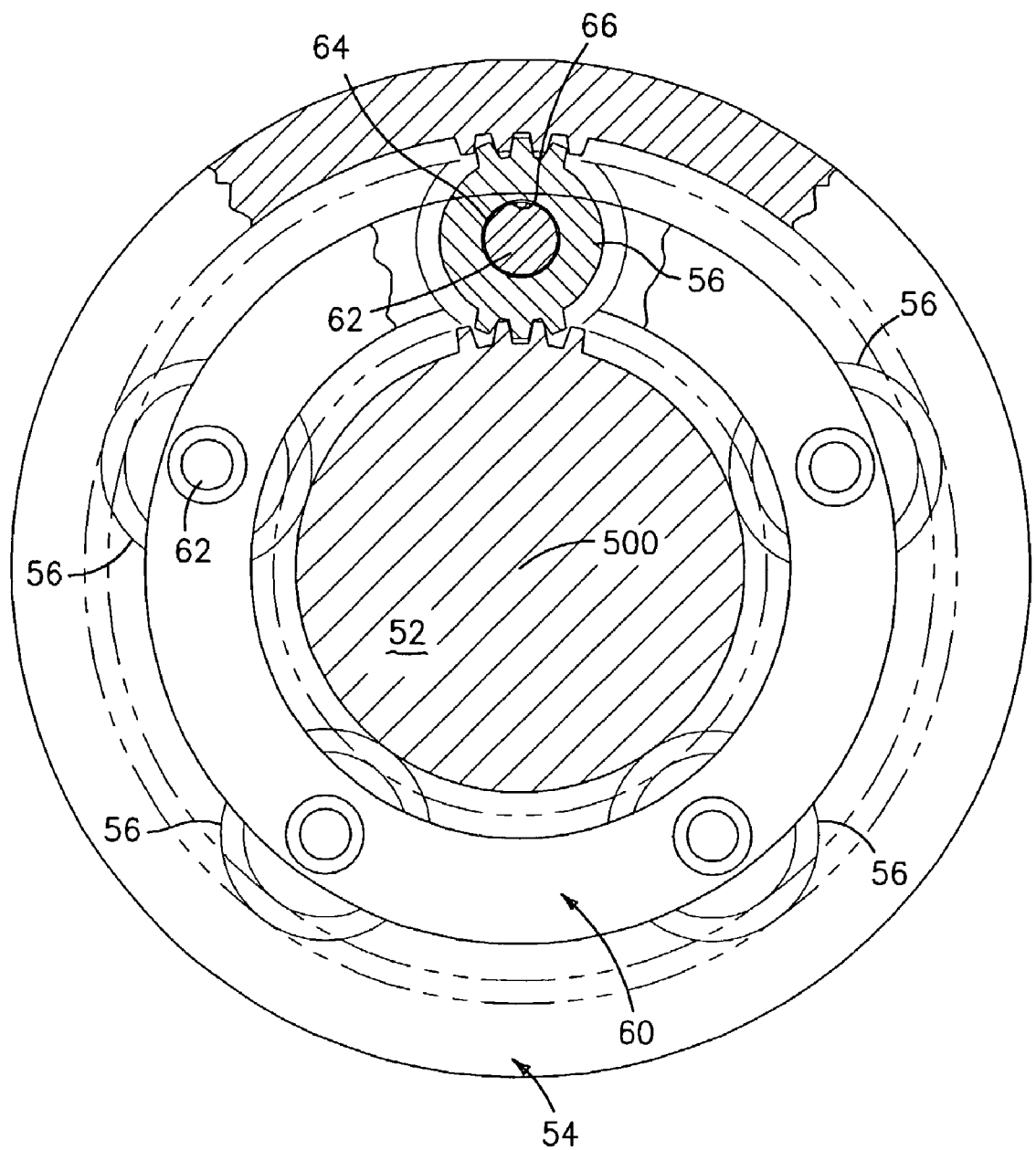
FIG. 3 is a transverse schematic sectional view of the transmission of FIG. 2.

FIG. 1 shows a geared turbofan engine 20 having a main housing 22 containing a rotor shaft assembly 24. An exemplary engine is a high-bypass turbofan. In such an engine, the normal cruise condition ratio of air mass flowing outside the core (e.g., the compressor sections and combustor) to air mass passing through the core (the bypass ratio) is typically in excess of 4.0 and, more narrowly, typically between 4.0 and 8.0. Via the shaft 24, a turbine section 26 drives high and low pressure compressor sections 28 and 30. The engine extends along a longitudinal axis 500 from a fore end to an aft end. Adjacent the fore end, a shroud 40 encircles a fan 42 and is supported by vanes 44. The rotor shaft assembly 24 drives the fan 42 through a reduction transmission 46. An exemplary reduction transmission is a planetary gear system. FIG. 2 shows further details of the transmission 46. A flexible input shaft 50 at a forward end of the rotor shaft assembly 24 is secured to a sun gear 52. The externally-toothed sun gear is encircled by an internally-toothed ring gear 54 which is substantially irrotatably mounted relative to the housing 22. A number of externally-toothed planet gears 56 are positioned between and enmeshed with the planet gear and ring gear. A cage or planet carrier assembly 60 carries the planet gears via associated journals 62. The journals have circumferential surface portions 64 closely accommodated within internal bore surfaces 66 of the associated planet gears. The speed reduction ratio is determined by the ratio of diameters of the ring gear to the sun gear. This ratio will substantially determine the maximum number of planet gears in a given ring. The actual number of planet gears will be determined by stability and stress/load sharing considerations. An exemplary reduction is between 2.2:1 and 3.5:1. An exemplary number of planet gears is between 3 and 7. FIG. 3 schematically shows the equally-spaced positioning of five planet gears 56 about the sun gear 52.

Figure 4:
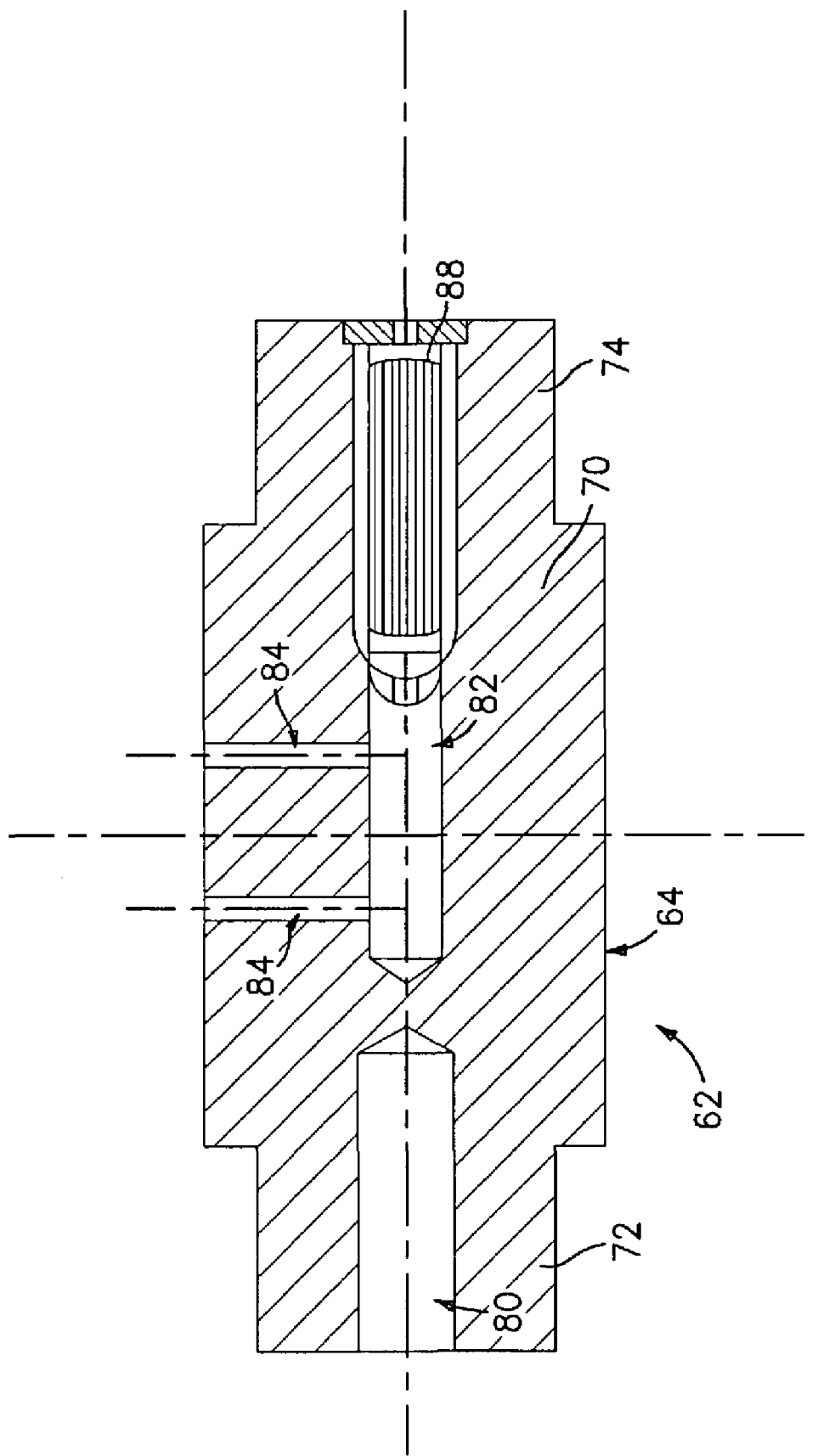
FIG. 4 is a longitudinal semi-schematic sectional view of a journal of the transmission of FIG. 2.

FIG. 4 shows additional structural details of an exemplary journal 62. The exemplary journal comprises the unitary combination of a central section 70 and shaft sections 72 and 74 extending from ends of the central section. The surface portion 64 is formed along the central section 70. Bores 80 and 82 may extend inward from the outboard ends of the shaft sections 72 and 74. The exemplary bore 82 forms the trunk of an oil conduit from which radial branch bores 84 extend to the surface 64 for maintaining the lubricant film between the journal and planet gear. A filter 88 may be located in the bore 82 for providing a final filtration stage for the oil. Diverse journal structures are known and may be developed, and the principles of the present invention may be applied to various such journals. For example, journals coated according to principles of the present invention may be used as drop-in replacements for existing journals, in which cases they could be otherwise structurally similar to those existing journals. Among various possible modifications to the schematic journal structure shown is the presence of undercuts or grooves extending inward from the end surfaces to the center section. Examples of such grooves are shown in U.S. Pat. No. 5,102,379.

The journal and gear are typically made of steel. Both may be made of the same steel, which is typically case-hardened by carburization. Commonly used steels include AMS 6265 and AMS 6308. In an exemplary embodiment, the surfaces 66 are formed by or covered with a bearing material such as a bronze coating. In the exemplary embodiment, the surfaces 64 are covered with a lubricous coating. Advantageously the coating is of a solid film coating material. A preferred coating is $MoS_2$-based. $MoS_2$ may applied by a physical vapor deposition (PVD). One example is sputtering. Such coating technology is available from several commercial suppliers, including Hohman Plating and Mfg., Inc., Dayton, Ohio. As applied, the coating may have an exemplary thickness between 0.3 and 3.0 µm. More preferably, such thickness may be between 1.0 and 2.0 µm. During use and prior to subsequent remanufacture or repair, the coating may wear and the thickness may be substantially reduced. Modified versions of this basic coating are discussed in "The Effects of Dopants on the Chemistry and Tribology of Sputter-Deposited $MoS_2$ Films" J. S. Zabinski, M. S. Donley and S. D. Walck, Tribology Transactions, Vol. 38, 1995, pp. 894–904, the disclosure of which is incorporated by reference herein as if set forth at length. One possible dopant combination is antimony and gold.

Another example is cathodic arc deposition. One such $MoS_2$-based coating involves fullerene-like $MoS_2$. Such coatings are disclosed in "Thin Films of Fullerene-Like $MoS_2$ Nanoparticles with Ultra-Low Friction and Wear" Manish Chhowalla & Gehan A. J. Amaratunga, Nature, Vol. 407, 2000, pp. 164–167, the disclosure of which is incorporated by reference herein as if set forth at length. That reference discloses deposition utilizing a localized high-pressure arc discharge. High pressure nitrogen gas is introduced via a hole in an $MoS_2$ target which is in turn ablated by cathodic arc discharge. The ablation generates fullerene-like nanoparticle $MoS_2$ which is carried by expansion from the high pressure region near the discharge to the journal being coated. The nanoparticles are characterized by curvature of the S—Mo—S planes to form irregularly shaped particles. Specifically, in conventional $MoS_2$ the atoms are arranged in a hexagonal lattice. Each lattice cell consists of six (prismatic) side faces and two (basal) end faces. Normally, these crystallographic planes are atomistically flat. However, when the atoms are forcibly displaced from their equilibrium (low energy) positions by energetic ions, the S—Mo—S atomic bonds will be stretched and result in distorted crystallographic planes. For example, the coating will tend to be formed of generally circular particles compared with sputtered particles tending to form columnar grains oriented substantially normal to the surface to which the coating is applied. The structure may be viewed by high-resolution transmission electron microscopy (HREM) and the associated lattice strain revealed by a shift of the (0002) peak in the x-ray diffraction (XRD) spectrum. Namely, the (0002) peak in the spectrum is located at a relatively low angle compared to that of a sputtered $MoS_2$ coating (e.g., at an angle of 8° compared to 13°). This shift indicates lattice expansion. Thus when so observed the fullerene-like coatings would be expected to typically have (000) peaks closer to 8° than to 13°.

Alternative $MoS_2$ coating application techniques include resin bonding of $MoS_2$ particles and thermal spray techniques.

Particularly promising test results have been observed for the fullerene-like $MoS_2$ and the essentially pure sputtered $MoS_2$. These appear to provide a particularly advantageous combination of load and duration performance in tests simulating a failure of an oiling lubrication system.

One or more embodiments of the present invention have been described. Nevertheless, it will be understood that various modifications may be made without departing from the spirit and scope of the invention. For example, assemblies may replace individual parts or vice versa. The principles may be applied both to various existing engines and transmissions and engines and transmissions yet to be developed. Accordingly, other embodiments are within the scope of the following claims.

What is claimed is:

1. A turbofan engine comprising:
   a turbine;
   a fan; and
   a geartrain coupling the turbine to the fan to permit the turbine to drive the fan with a reduction and including a plurality of gears of which at least a first gear is supported by a journal, the journal having a coating comprising $MoS_2$.

2. The engine of claim 1 wherein the fan is forward of the turbine and has an operated bypass ratio of at least 4.0.

3. The engine of claim 1 wherein the coating comprises sputter-deposited $MoS_2$.

4. The engine of claim 3 wherein the coating consists essentially of sputter-deposited $MoS_2$.

5. The engine of claim 1 wherein the coating comprises fullerene-like $MoS_2$.

6. The engine of claim 1 wherein the coating has an XRD (0002) peak of about 8°.

7. The engine of claim 1 wherein the journal comprises a steel element on which said coating is deposited.

8. The engine of claim 1 wherein the reduction is between 2.2:1 and 3.5:1.

9. The engine of claim 1 wherein the coating consists essentially of arc-deposited $MoS_2$.

10. The engine of claim 1 wherein the coating has a thickness between 1.0 and 2.0 µm.

11. The engine of claim 1 wherein the coating has a thickness between 0.3 and 3.0 µm.

12. The engine of claim 1 wherein:
    the journal is further oil-lubricated in addition to the existent $MoS_2$ coating.

13. The engine of claim 12 wherein:
    the coating consists essentially of fullerene-like $MoS_2$.

14. A turbofan engine comprising:
    a turbine;
    a fan; and
    a geartrain coupling the turbine to the fan to permit the turbine to drive the fan with a reduction and including a plurality of gears of which at least a first gear is supported by a journal, the journal having a coating consisting essentially of at least one of sputter-deposited $MoS_2$ and fullerene-like $MoS_2$.

15. The engine of claim 14 wherein the first gear has a journal-engaging surface coated with bronze.

16. The engine of claim 14 wherein the journal is further normally oil lubricated in addition to said coating and said coating provides extended operation after a loss of said oil in an abnormal condition.

* * * * *